(12) United States Patent
Kamgaing (10) Patent No.: US 9,786,581 B2
(45) Date of Patent: Oct. 10, 2017

(54) THROUGH-SILICON VIA (TSV)-BASED DEVICES AND ASSOCIATED TECHNIQUES AND CONFIGURATIONS

(71) Applicant: INTEL CORPORATION, Santa Clara, CA (US)

(72) Inventor: Telesphor Kamgaing, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 93 days.

(21) Appl. No.: 14/203,415

(22) Filed: Mar. 10, 2014

(65) Prior Publication Data

US 2015/0255372 A1 Sep. 10, 2015

(51) Int. Cl.
| | |
|---|---|
| *H01L 29/84* | (2006.01) |
| *H01L 23/48* | (2006.01) |
| *H01L 23/64* | (2006.01) |
| *H01L 49/02* | (2006.01) |
| *B81C 1/00* | (2006.01) |
| *H01L 27/06* | (2006.01) |

(52) U.S. Cl.
CPC ........ *H01L 23/481* (2013.01); *B81C 1/00246* (2013.01); *B81C 1/00301* (2013.01); *H01L 23/642* (2013.01); *H01L 23/647* (2013.01); *H01L 28/20* (2013.01); *H01L 28/60* (2013.01); *B81B 2201/0271* (2013.01); *B81B 2207/096* (2013.01); *H01L 27/0694* (2013.01); *H01L 2224/16225* (2013.01); *H01L 2924/15311* (2013.01)

(58) Field of Classification Search
CPC ............... H01L 23/481; H01L 23/5223; H01L 23/5228; H01L 23/647; H01L 23/642; H01L 23/49827; B81B 7/007
See application file for complete search history.

(56) References Cited

U.S. PATENT DOCUMENTS

| | | | | |
|---|---|---|---|---|
| 5,614,743 | A  * | 3/1997 | Mochizuki ........ | H01L 21/76898 257/275 |
| 8,525,278 | B2 * | 9/2013 | Chu ........................ | H01L 24/81 257/415 |
| 2012/0133021 | A1 * | 5/2012 | Joblot ............... | H01L 21/76898 257/532 |
| 2014/0175651 | A1 | 6/2014 | Pelto et al. | |

* cited by examiner

*Primary Examiner* — Matthew Landau
*Assistant Examiner* — Scott Stowe
(74) *Attorney, Agent, or Firm* — Schwabe, Williamson & Wyatt, P.C.

(57) ABSTRACT

Embodiments of the present disclosure are directed toward through-silicon via (TSV)-based devices and associated techniques and configurations. In one embodiment, an apparatus includes a die having active circuitry disposed on a first side of the die and a second side disposed opposite to the first side, a bulk semiconductor material disposed between the first side and the second side of the die and a device including one or more of a capacitor, resistor or resonator disposed in the bulk semiconductor material, the capacitor, resistor or resonator including one or more TSV structures that extend through the bulk semiconductor material, an electrically insulative material disposed in the one or more TSV structures and an electrode material or resistor material in contact with the electrically insulative material within the one or more TSV structures.

20 Claims, 7 Drawing Sheets

THROUGH-SILICON VIA (TSV)-BASED DEVICES AND ASSOCIATED TECHNIQUES AND CONFIGURATIONS

FIELD

Embodiments of the present disclosure generally relate to the field of integrated circuits, and more particularly, to through-silicon via (TSV)-based devices and associated techniques and configurations.

BACKGROUND

Devices such as, for example, capacitors, resistors, and/or resonators are integrated in package assemblies of many modern communication and computing systems. For example, capacitors may traditionally be used in radio frequency (RF) circuits and in power delivery networks of processors and other logic chipsets. For power delivery, one of the key challenges includes providing high capacitance density and positioning the capacitors as close as possible to a central processor unit (CPU) core to reduce switching noise or ground bounce associated with power delivery network inductance. One approach to reduce inductance is to use on-chip capacitance such as metal-insulator-metal (MIM) capacitors, but the MIM capacitors may still have relatively low capacitance density. Other approaches include forming capacitors on a package substrate or other component external to a die that uses the capacitors. Integration of other devices such as resistors and/or resonators may raise similar challenges.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure describe through-silicon via (TSV)-based devices and associated techniques and configurations. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B) (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a system-on-chip (SoC), a processor (shared, dedicated, or group) and/or memory (shared, dedicated, or group) that execute one or more software or firmware programs, a combinational logic circuit, and/or other suitable components that provide the described functionality.

The term "TSV" is not limited to embodiments where a die is composed of silicon and may apply to other suitable semiconductor materials according to various embodiments. In this regard, the term "TSV" as used herein may generally refer to a through-body via or through-body connection.

Figure 1:
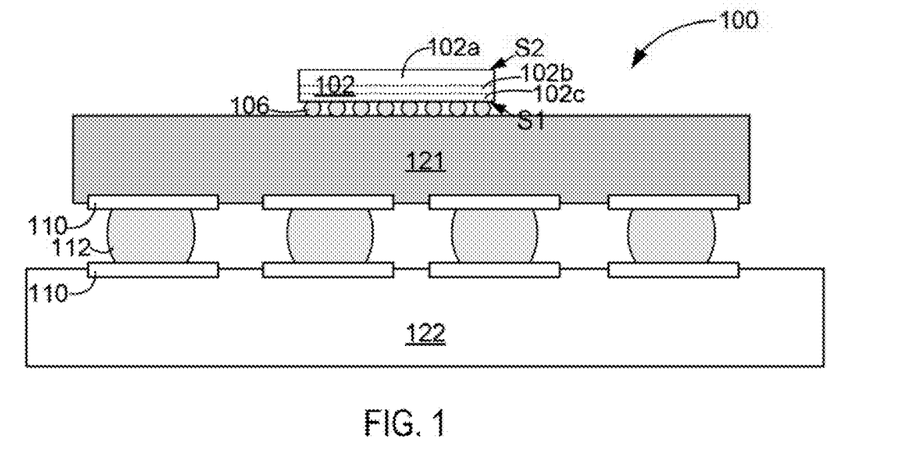
FIG. 1 schematically illustrates a cross-section side view of an example integrated circuit (IC) package assembly including TSV-based devices, in accordance with some embodiments.

FIG. 1 schematically illustrates a cross-section side view of an example integrated circuit (IC) package assembly (hereinafter "package assembly 100") including TSV-based devices, in accordance with some embodiments. According to various embodiments, the package assembly 100 may include one or more dies (hereinafter "die 102") having one or more TSV-based devices including passive devices such as, for example, capacitors or resistors and/or resonators that are integrally formed as part of the die 102. The die 102 may be electrically and/or physically coupled with a package substrate 121. In some embodiments, the package substrate 121 may be electrically coupled with a circuit board 122, as can be seen.

The die 102 may represent a discrete product made from a semiconductor material (e.g., silicon) using semiconductor fabrication techniques such as thin film deposition, lithography, etching and the like used in connection with forming complementary metal-oxide-semiconductor (CMOS) devices. In some embodiments, the die 102 may be, include, or be a part of a processor, memory, SoC, or ASIC in some embodiments. In some embodiments, an electrically insulative material such as, for example, molding compound or underfill material (not shown) may encapsulate at least a portion of the die 102 and/or die-level interconnect structures 106.

The die 102 can be attached to the package substrate 121 according to a wide variety of suitable configurations including, for example, being directly coupled with the package substrate 121 in a flip-chip configuration, as depicted. In the flip-chip configuration, an active side, S1, of the die 102 including active circuitry is attached to a surface of the package substrate 121 using die-level interconnect structures 106 such as bumps, pillars, or other suitable structures that may also electrically couple the die 102 with the package substrate 121. The active side S1 of the die 102 may include active circuitry such as, for example, transistor devices, and an inactive side, S2, may be disposed opposite to the active side S1, as can be seen.

The die 102 may generally include a semiconductor substrate substantially composed of a bulk semiconductor material 102a, one or more device layers (hereinafter "device layer 102b"), and one or more interconnect layers (hereinafter "interconnect layer 102c"). The bulk semiconductor material may include silicon or another suitable semiconductor material, in some embodiments. The device layer 102b may represent a region where active devices such as transistor devices are formed on the semiconductor substrate. The device layer 102b may include, for example, structures such as channel bodies and/or source/drain regions of transistor devices. The interconnect layer 102c may include interconnect structures that are configured to route electrical signals to or from the active devices in the device layer 102b. For example, the interconnect layer 102c may include trenches and/or vies formed through a dielectric material to provide electrical routing and/or contacts. According to various embodiments, the die 102 may comport with embodiments described in connection with the dies of FIGS. 2, 3, 4, 6, 7, and 8.

In some embodiments, the die-level interconnect structures 106 may be configured to route electrical signals between the die 102 and other electrical devices. The electrical signals may include, for example, input/output (I/O) signals and/or power/ground signals that are used in connection with operation of the die 102.

In some embodiments, the package substrate 121 is an epoxy-based laminate substrate having a core and/or build-up layers such as, for example, an Ajinomoto Build-up Film (ABF) substrate. In other embodiments, the package substrate 121 may be a circuit board such as, for example, a printed circuit board (PCB) formed using any suitable PCB technique. The package substrate 121 may include other suitable types of substrates in other embodiments including, for example, substrates formed from glass, ceramic, or semiconductor materials.

The package substrate 121 may include electrical routing features configured to route electrical signals to or from the die 102. The electrical routing features may include, for example, pads or traces (not shown) disposed on one or more surfaces of the package substrate 121 and/or internal routing features (not shown) such as, for example, trenches, vies, or other interconnect structures to route electrical signals through the package substrate 121. For example, in some embodiments, the package substrate 121 may include electrical routing features such as pads (not shown) configured to receive the respective die-level interconnect structures 106 of the die 102.

The circuit board 122 may be a printed circuit board (PCB) composed of an electrically insulative material such as an epoxy laminate. For example, the circuit board 122 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Interconnect structures (not shown) such as traces, trenches, or vias may be formed through the electrically insulating layers to route the electrical signals of the die 102 through the circuit board 122. The circuit board 122 may be composed of other suitable materials in other embodiments. In some embodiments, the circuit board 122 is a motherboard (e.g., motherboard 1302 of FIG. 13).

Package-level interconnects such as, for example, solder balls 112 may be coupled to one or more pads (hereinafter "pads 110") on the package substrate 121 and/or on the circuit board 122 to form corresponding solder joints that are configured to further route the electrical signals between the package substrate 121 and the circuit board 122. The pads 110 may be composed of any suitable electrically conductive material such as metal including, for example, nickel (Ni), palladium (Pd), gold (Au), silver (Ag), copper (Cu), and combinations thereof. Other suitable techniques to physically and/or electrically couple the package substrate 121 with the circuit board 122 may be used in other embodiments.

The package assembly 100 may include a wide variety of other suitable configurations in other embodiments including, for example, suitable combinations of flip-chip and/or wire-bonding configurations, interposers, multi-chip package configurations including system-in-package (SiP) and/or package-on-package (PoP) configurations. Other suitable techniques to route electrical signals between the die 102 and other components of the package assembly 100 may be used in some embodiments.

Figure 2:
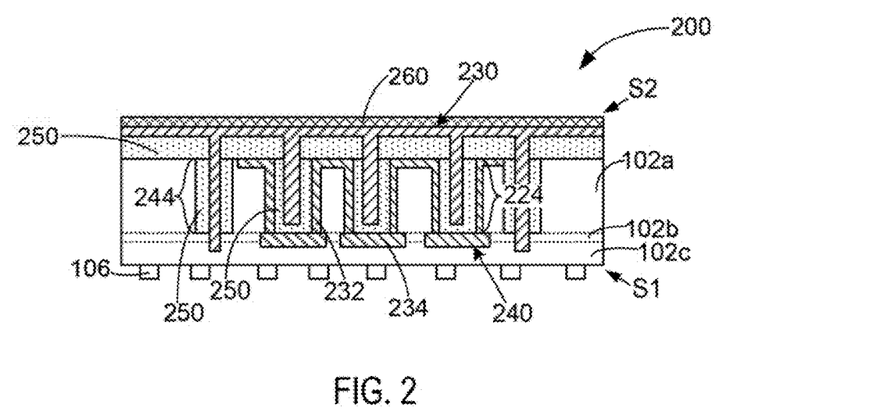
FIG. 2 schematically illustrates a cross-section side view of a die including a TSV-based capacitor, in accordance with some embodiments.

FIG. 2 schematically illustrates a cross-section side view of a die 200 including a TSV-based capacitor, in accordance with some embodiments. The die 200 may comport with embodiments described in connection with die 102 of FIG. 1 and vice versa.

The TSV-based capacitor may include one or more through-silicon via (TSV) structures 224 that extend through bulk semiconductor material 102a of the die 102. The one or more TSV structures 224 may include regions where portions of the bulk semiconductor material 102a have been removed to provide a conduit between a back side (e.g., the second side S2) of the die 200 and the device layer 102b and/or interconnect layer 102c on a front side (e.g., the first side S1) of the die 200.

The TSV-based capacitor may include a first electrode 230 and second electrode 240 capacitively coupled through electrically insulative material 250, as can be seen. The first electrode 230 may include portions that are disposed within the one or more TSV structures 224 and may be in contact with the electrically insulative material 250, as can be seen. In some embodiments, portions of the first electrode 230 may extend into the one or more TSV structures 224, as can be seen. In one embodiment, the first electrode 230 may include portions that extend a distance into the one or more TSV structures 224 that is greater than half of a thickness of the bulk semiconductor material 102a, as can be seen. The second electrode 240 may include an electrode material disposed on surfaces of the one or more TSV structures 224 such as, for example, electrode material 232 disposed on sidewalls of the one or more TSV structures 224 and electrode material (hereinafter "land structures" or "catch cups 234") disposed in a device layer 102b and/or interconnect layer 102c of the die 102, as can be seen.

The first electrode 230 and the second electrode 240 may be composed of any suitable electrode material. For example, in some embodiments, the first electrode 230 and the second electrode 240 may each be composed of a metal such as copper (Cu). In other embodiments, the first electrode 230 may be composed of a metal and the second electrode 240 may be composed of grounded silicon. In some embodiments, the first electrode 230 may be a positive electrode.

In some embodiments, the electrically insulative material 250 may be a capacitance dielectric material. For example, the electrically insulative material 250 may be composed of silicon nitride (SiN) or silicon oxide ($SiO_2$). The electrically insulative material 250 may include other suitable materials in other embodiments.

The die 200 may further include one or more through-silicon vias (TSVs) 244 that are configured to route electrical signals such as, for example, power between the TSV-based capacitor (e.g., the first electrode 230) and active circuitry of the device layer 102b for use in connection with operation of the active circuitry. In the depicted configuration, the TSV-based capacitor is configured to provide power to the active circuitry (e.g., device layer 102b) disposed on the first side S1 of the die 200 through the TSVs 244. In some embodiments, the TSV-based capacitor may be coupled directly to a central processing unit (CPU) core of the die 200 to provide stand-alone capacitance or may be used in conjunction with other capacitive elements such as, for example, on-chip metal-insulator-metal (MIM) capacitors or other off-chip capacitive elements.

The TSVs 244 may include, for example, a conduit formed through the bulk semiconductor material 102a to provide a pathway between the second side S2 and the first side S1 of the die 200. In some embodiments, the TSVs 244 may include portions of the first electrode 230 that extend from the second side S2 of the die 200 through the bulk semiconductor material 102a and into a device layer 102b and/or interconnect layer 102c of the die 200. The TSVs 244 may further include an electrically insulative material 250 disposed between the electrode material and the bulk semiconductor material 102a.

According to various embodiments, one or more TSV structures 224 as described herein may generally serve as a basis for devices (e.g., capacitor, resistor, resonator, etc.) formed in the die 200, and one or more TSVs 244 as described herein may generally serve to route electrical signals between the second side S2 and the first side S1 of the die 200. Although not depicted, the TSVs 244 may also include catch cups 234 disposed in the device layer 102b and/or interconnect layer 102c to facilitate formation of the TSVs 244 in some embodiments.

In some embodiments, a passivation layer 260 may be disposed on the first electrode 230 on the second side S2 of the die 200, as can be seen. The passivation layer 260 may include any of a wide variety of suitable materials to seal or protect the underlying components from handling or exposure to the environment. For example, in some embodiments, the passivation layer 260 may be composed of a wafer photoresist (WPR), SiN, $SiO_2$, benzocyclobutene (BCB), polyimide, and the like.

Die-level interconnect structures 106 may be formed on the first side S1 of the die 200 to route electrical signals to or from the die 200. For example, the die-level interconnect structures 106 may be configured to route power to or from the TSV-based capacitor according to various embodiments.

Figure 3:
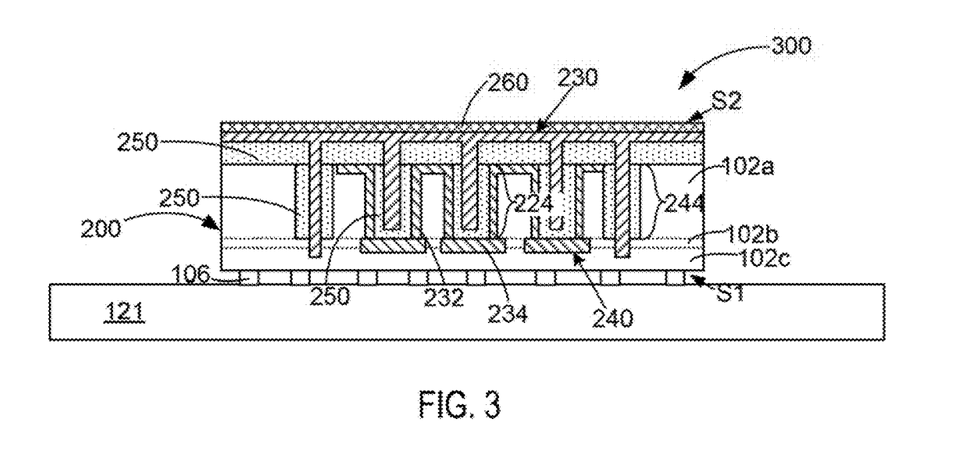
FIG. 3 schematically illustrates a cross-section side view of a package assembly including a die having a TSV-based capacitor, in accordance with some embodiments.

FIG. 3 schematically illustrates a cross-section side view of a package assembly 300 including a die 200 having a TSV-based capacitor, in accordance with some embodiments. According to various embodiments, the die 200 may be coupled with a package substrate 121 using die-level interconnect structures 106, as can be seen. The die 200 may be coupled with other suitable components using other configurations in other embodiments.

Figure 4:
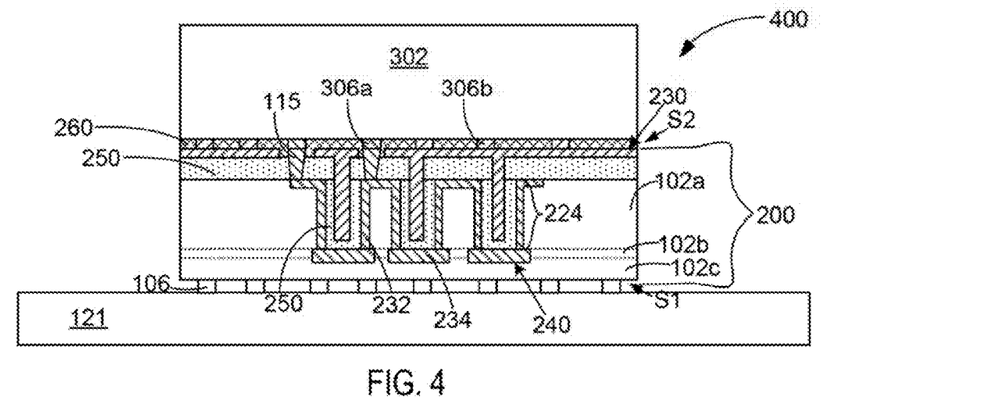
FIG. 4 schematically illustrates a cross-section side view of another package assembly including a die having a TSV-based capacitor, in accordance with some embodiments.

FIG. 4 schematically illustrates a cross-section side view of another package assembly 400 including a die 200 having a TSV-based capacitor, in accordance with some embodiments. According to various embodiments, the die 200 including the TSV-based capacitor may be coupled with another die 302 (e.g., in a three-dimensional (3D) stacked arrangement) that is configured to receive power from the TSV-based capacitor of the die 200. For example, the package assembly may depict a stacked die system, where the TSV-based capacitor implemented in the bulk silicon of a first SoC die (e.g., die 200) is used for power supply into at least a second stacked die (e.g., die 302).

In some embodiments, the first electrode 230 of die 200 may be coupled with active circuitry of die 302 using any of a variety of suitable interconnect structures 306b such as, for example, bumps, vias, traces, pillars, or combinations thereof. The second electrode 240 (e.g., including electrode material 232) of die 200 may be coupled with the second die 302 to provide a ground connection using any of a variety of suitable interconnect structures 306a such as, for example, bumps, vias 115, traces, pillars, or combinations thereof. This ground connection may then be connected to the remaining ground of the three dimensional integrated circuit (3D-IC), which results in reduced ground loop inductance when the TSV-based capacitor is used as decoupling capacitor in the power delivery network. Other suitable configurations to route power from the TSV-based capacitor of the die 200 to another die may be used in other embodiments.

FIG. 6 schematically illustrates a cross-section side view of a die (e.g., die 500a, 500b, 500c, 500d, 500e) having a TSV-based capacitor during various stages of fabrication, in accordance with some embodiments. The dies 500a, 500b, 500c, 500d, and 500e may comport with embodiments described in connection with die 102 of FIG. 1 or die 200 of FIGS. 2-4 and vice versa.

Figure 5:
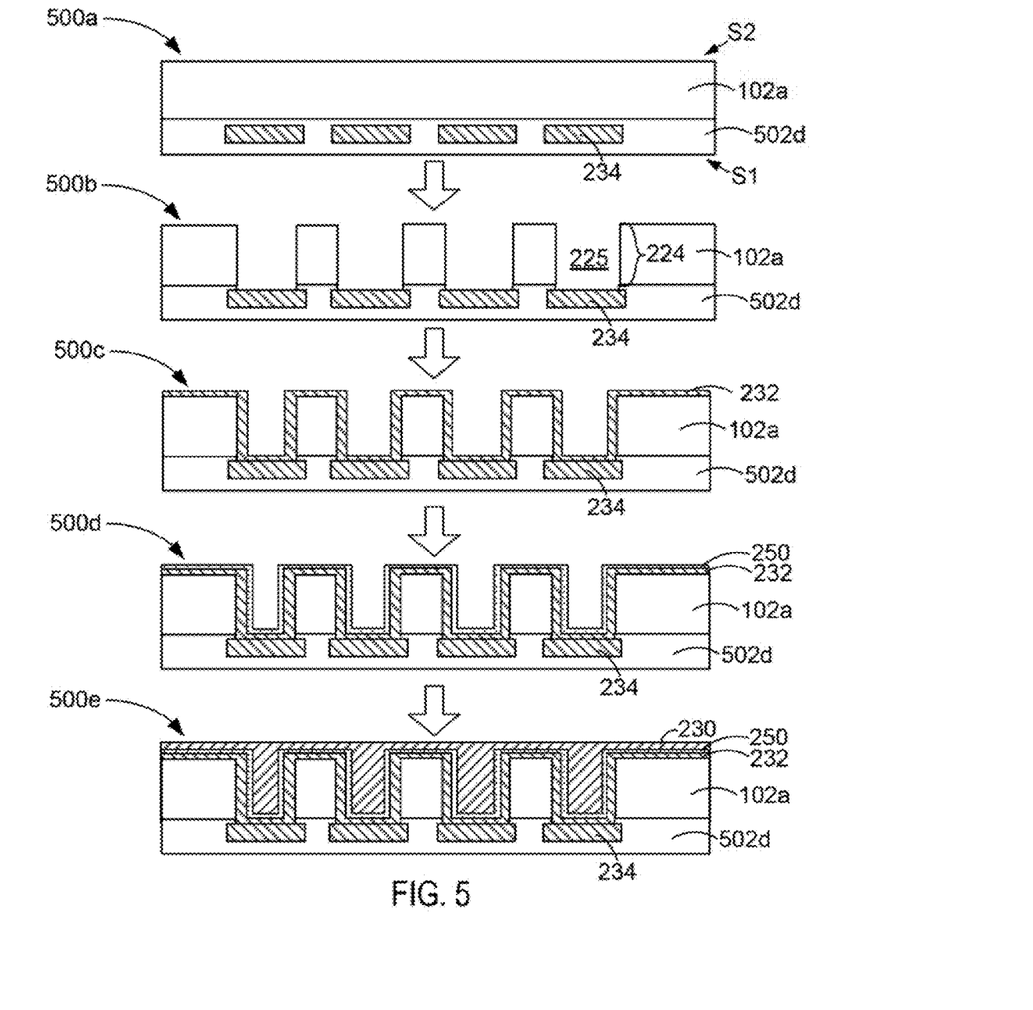
FIG. 5 schematically illustrates a cross-section side view of a die having a TSV-based capacitor during various stages of fabrication, in accordance with some embodiments.

The die 500a is depicted subsequent to fabricating active circuitry and/or interconnects to route electrical signals of the active circuitry on a first side S1 of the die 500a. For example, device/interconnect layer 502d may represent a device layer 102b and/or interconnect layer 102c formed on the first side S1 of the die 500a. In some embodiments, land structures such as catch cups 234 may be formed in the device/interconnect layer 502d to facilitate formation of TSV structures through the die 500a and/or to provide electrode material of a TSV-based capacitor. The catch cups 234 may include, for example, metal structures such as, for example, copper trenches and/or vias formed in the device/interconnect layer 502d as part of device formation or interconnect layer formation using semiconductor fabrication techniques.

The die 500b is depicted subsequent to removing portions of the bulk semiconductor material 102a from the second side S2 of the die 500b to form openings or conduits 225 of respective through-silicon via (TSV) structures 224 between the second side S2 of the die 500b and the device/interconnect layer 502d on the first side S1 of the die 500b. In some embodiments, the conduits 225 may be formed by a patterning process such as, for example, lithography and/or etch processes. In some embodiments, the catch cups 234 may be configured to provide an etch stop layer for an etch process that removes portions of the bulk semiconductor material 102a. Removing the portions of the bulk semiconductor material 102a may expose the catch cups 234.

The die 500c is depicted subsequent to depositing an electrode material 232 (e.g., to form second electrode 240 of FIGS. 2-4). In some embodiments, the electrode material 232 may be conformally deposited to cover exposed surfaces including sidewall surfaces of the one or more TSV structures 224 that are exposed by removing portions of the bulk semiconductor material 102a, as can be seen.

The die 500d is depicted subsequent to depositing an electrically insulative material 250 to form a capacitance dielectric of the TSV-based capacitor. In some embodiments, electrically insulative material 250 may be conformally deposited on the electrode material 232.

The die 500e is depicted subsequent to depositing an electrode material to form an electrode (e.g., first electrode 230 of FIGS. 2-4) that is capacitively coupled with the electrode material 232. In some embodiments, the electrode material of the first electrode 230 may be deposited on the electrically insulative material 250. The deposited electrode material 234 may fill a remaining region of the openings 225 of the TSV structures 224, as can be seen.

Figure 6:
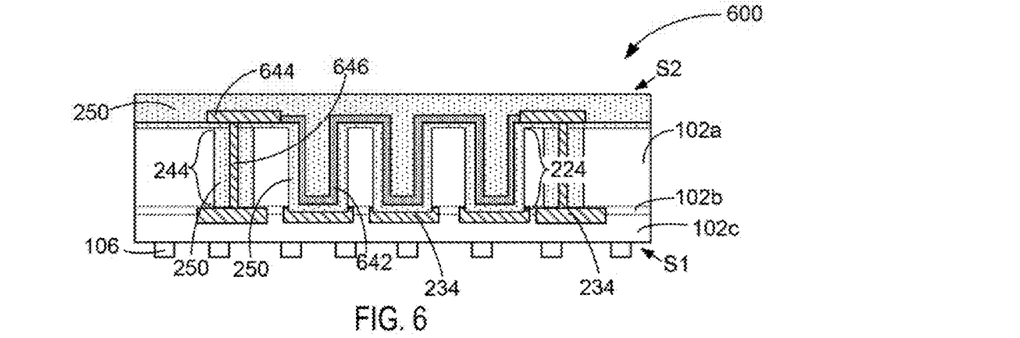
FIG. 6 schematically illustrates a cross-section side view of a die including a TSV-based resistor according to a first configuration, in accordance with some embodiments.

FIG. 6 schematically illustrates a cross-section side view of a die 600 including a TSV-based resistor according to a first configuration, in accordance with some embodiments. The die 600 may comport with embodiments described in connection with die 102 of FIG. 1 or other dies described herein. According to various embodiments, the TSV-based resistor may include a resistor material 642 disposed in one or more TSV structures 224, as can be seen. In the depicted embodiment, the TSV-based resistor may be a 3D meander resistor.

In some embodiments, an electrically insulative material 250 may be disposed between the resistor material 642 and the bulk semiconductor material 102a, as can be seen, to provide a dielectric liner between the resistor material 642 and reduce or prevent electrical shorts. The resistor material 642 may be electrically coupled with active circuitry disposed in device layer 102b through TSVs 244. For example, electrical routing features such as redistribution layer (RDL) including traces 644 may electrically couple the resistor material 642 with electrically conductive features 646 of the TSVs 244 that are electrically coupled with the active circuitry. In other embodiments, electrical routing features may couple the resistor material 642 with active circuitry of another die to provide resistance for the other die.

The resistor material may include a wide variety of suitable materials including, for example, carbon- or ceramic-based materials. For example, ceramic materials may include tantalum nitride, lead oxide, ruthenium oxide, nickel chromium, or bismuth iridate. Other suitable resistor materials may be used in other embodiments.

Although the depicted embodiment shows a case where three adjacent TSV structures 224 are used to implement resistance, the resistor material 642 of a TSV-based resistor may use more or fewer TSV structures 224 in series or in parallel in other embodiments. A total resistance of the TSV-based resistor may be determined by a resistivity and physical dimensions of the resistor material 642 including, for example, width, length, and thickness. In the depicted embodiment, the resistor material 642 may be formed completely above the device layer 102b and occupy part of the area of the bulk semiconductor material 102a and the RDL including traces 644. For example, in some embodiments, the resistor material 642 may not be disposed in the device layer 102b as depicted in FIG. 6. In some embodiments, electrically insulative material 250 may be deposited to form an electrically insulative layer on the electrical routing features and/or resistor material 642, as can be seen.

The TSV-based resistor may provide a more compact resistor relative to resistors that do not utilize vertical dimensions (e.g., along sidewalls of the TSV structures 224), which may allow for reduction of an overall footprint of IC features in a horizontal direction. In some embodiments, a two-dimensional (2D) resistor (e.g., meander resistor) may be formed on top of the electrically insulative material 250 that is disposed directly over the bulk semiconductor material 102a in a region where no TSV structures 224 are formed. Such a 2D resistor may be electrically coupled with active circuitry in the device layer 102b through TSVs 244 in some embodiments. Combinations of 2D and 3D resistors may be used in some embodiments.

Figure 7:
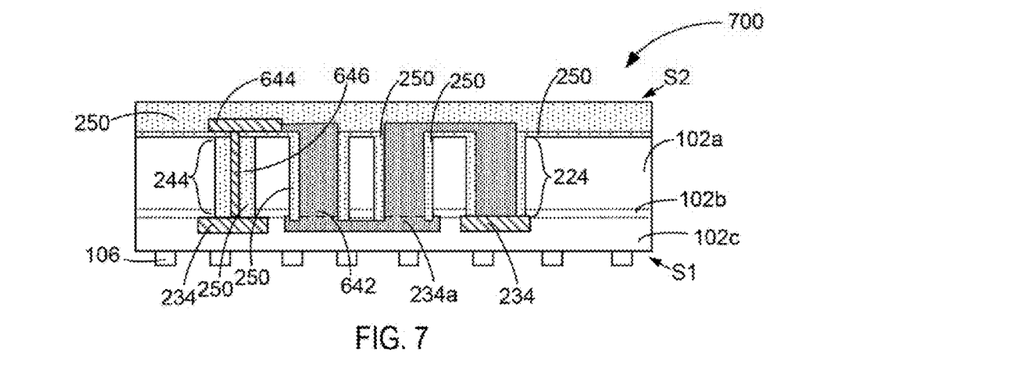
FIG. 7 schematically illustrates a cross-section side view of a die including a TSV-based resistor according to a second configuration, in accordance with some embodiments.

FIG. 7 schematically illustrates a cross-section side view of a die 700 including a TSV-based resistor according to a second configuration, in accordance with some embodiments. The die 700 may comport with embodiments described in connection with die 102 of FIG. 1 or other dies described herein. According to various embodiments, the TSV-based resistor may include a resistor material 642 disposed in one or more TSV structures 224, as can be seen. In the depicted embodiment, the TSV-based resistor may be a 3D meander resistor.

In the second configuration depicted in FIG. 7, the catch cup area is used as part of the TSV-based resistor. For example, the TSV structures 224 may be lined with electrically insulative material 250 and subsequently filled with resistor material 642. In some embodiments, a catch-cup portion 234a of the TSV structures 224 may be formed by depositing resistor material 642 in device layer 102b and/or interconnect layer 102c. The resistor material 642 of the catch-cup portion 234 may extend horizontally to connect resistor material 642 in different TSV structures 224, as can be seen. In other embodiments, the catch-cup portion 234a of the TSV structures 224 may be composed of an electrode such as, for example, metal. The catch-cup portion 234a may be used as an etch stop layer in the formation of the TSV structures 224 according to various embodiments. In some embodiments, conduits of the TSV structures 224 may have a non-circular profile from a top view that can be used to control a width of the TSV-based resistor for either or both of the first configuration depicted in FIG. 6 or the second configuration depicted in FIG. 7. The conduits of the TSV structures 224 may have other suitable profile shapes or configurations in other embodiments.

Figure 8:
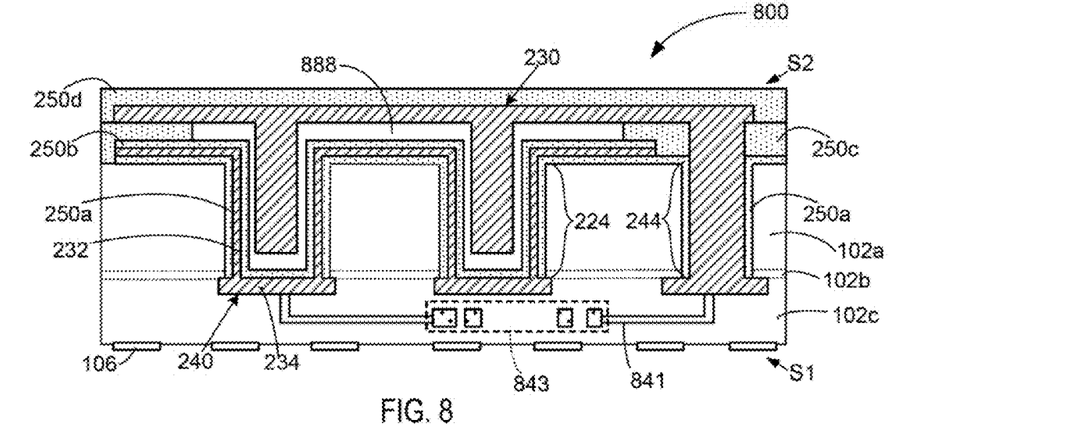
FIG. 8 schematically illustrates a cross-section side view of a die including a TSV-based resonator, in accordance with some embodiments.

FIG. 8 schematically illustrates a cross-section side view of a die 800 including a TSV-based resonator, in accordance with some embodiments. The die 800 may comport with embodiments described in connection with die 102 of FIG. 1 or other dies described herein. The TSV-based resonator may be an on-die integrated microelectromechanical (MEM) resonator that incorporates the TSV structures 224 as part of the resonator structure. The TSV-based resonator may be primarily formed on the second side S2 of the die 800 where a first electrode 230 of the resonator is disposed within the TSV structures 224 and where one or more of the TSV structures 224 may be connected in parallel to serve as proof mass for acceleration sensing.

According to various embodiments, the TSV-based resonator may include a second electrode 240 disposed within the TSV structures 224, as can be seen. The first electrode 230 and the second electrode 240 may be capacitively coupled together and may be formed according to similar techniques as described in connection with the TSV-based capacitor, in some embodiments. The first electrode 230 and the second electrode 240 may be separated by a dielectric material such as, for example, air in an air gap 888. The air gap 888 may provide a travel path for the first electrode 230 when the die 800 is in motion and/or when a voltage is applied between the first electrode 230 and the second electrode 240. The air gap 888 may have a vertical dimension that may provide a large range of motion of the TSV-based resonator and may allow a larger capacitance tuning range relative to conventional MEM resonators. Providing larger TSV structures 224 may allow integration of higher quality (Q) factor resonators with the die 800. The first electrode 230 and second electrode 240 may be separated by other suitable materials in other embodiments including, for example, a tunable material such as piezoelectric (e.g., piezo dielectric) material.

The second electrode 240 (e.g., electrode material 232 and/or catch cups 234) may be formed using a wide variety of suitable electrode materials including, for example, a metal such as copper. The second electrode 240 may be electrically insulated from the bulk semiconductor material 102a by electrically insulative material that forms a first dielectric liner 250a (e.g., on sidewall surfaces of the TSV structures 224) between the electrode material 232 and the bulk semiconductor material 102a, as can be seen. In some embodiments, the second electrode 240 may be a floating electrode that may be connected to any point of an electrical circuit. In some embodiments, a second dielectric liner 250b comprising electrically insulative material may be disposed on the second electrode 240, as can be seen, to prevent shorting when the first electrode 230 is in motion.

In some embodiments, the first electrode 230 may be composed of multiple blind TSVs, which may include conductive structures that extend into the TSV structures 224 without providing direct electrical connection through the TSV structures, as can be seen. The conductive structures of the first electrode 230 that extend into the TSV structures 224 may be coupled together using, for example, RDL traces. In some embodiments, the first electrode 230 may include a network of RDL traces formed in a meshed structure with openings to facilitate removal of a sacrificial dielectric during formation of the air gap 888.

In some embodiments, electrically insulative material may be disposed on the bulk semiconductor material 102a, the first dielectric liner 250a, and/or the second dielectric liner 250b, as can be seen, to form a third dielectric 250c. The third dielectric 250c may be disposed between the first electrode 230 and the second electrode 240 and further disposed between the second dielectric liner 250b and the first electrode 230, as can be seen, in some embodiments. According to various embodiments, the third dielectric 250c may serve as an anchor point for the capacitor top electrodes that may also act as a mechanical beam for the TSV-based resonator. The third dielectric 250c may be the same material that is used as a sacrificial dielectric for the air gap in some embodiments.

In some embodiments, electrically insulative material may be disposed on the first electrode 230 to form a fourth dielectric 250d, as can be seen. The fourth dielectric 250d may be composed of a flexible or ultra-thin material to facilitate motion of the first electrode 230 in some embodiments. For example, the fourth dielectric 250d may include SiN, SiO$_2$, BCB, polydimethylsiloxane (PDMS), polytetrafluoroethylene (PTFE), polyamide, or other elastomeric substrates.

According to some embodiments, the TSV-based resonator may be used as a sensing element for acceleration (e.g., acceleration sensor). For example, the TSV-based resonator may use a combined weight of the TSV structures 224 as a proof mask and use suspended RDL traces of the first electrode 230 as beams to sense acceleration. In one embodiment, a variable capacitor formed by the first electrode 230 and second electrode 240 may be connected to an inductor such as, for example, an on-die inductor 843 using electrical routing 841 formed in the interconnect layer 102c portion of the die 800 to form an electrical LC resonator. The first electrode 230 may be coupled with the inductor 843 using one or more TSVs 244, as can be seen. The inductor 843 may be electrically coupled with portions (e.g., catch cups 234) of the second electrode 240 that are disposed in device layer 102b or interconnect layer 102c of the die 800. The variable capacitor may be connected to the on-die inductor 843 in parallel or in series. Change in capacitance resulting from a motion or applied voltage may lead to a shift in the resonance frequency, which in turn may correspond with acceleration.

Embodiments described in connection with the TSV-based devices herein may be suitably combined according to various embodiments. For example, a die may include one or more of a TSV-based capacitor, TSV-based resistor and/or TSV-based resonator as described herein in some embodiments.

Figure 9:
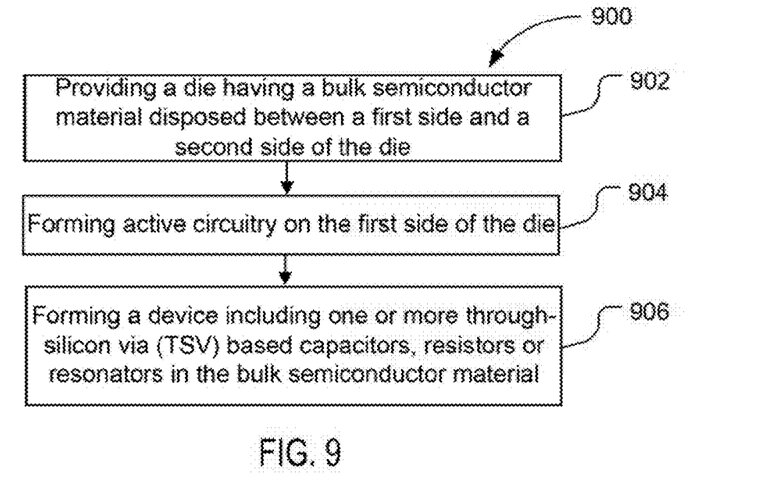
FIG. 9 schematically illustrates a flow diagram for a method of fabricating a die including a TSV-based device, in accordance with some embodiments.

FIG. 9 schematically illustrates a flow diagram for a method 900 of fabricating a die including a TSV-based device (e.g., TSV-based capacitor, TSV-based resistor, TSV-based resonator), in accordance with some embodiments. The method 900 may comport with techniques described in connection with FIGS. 1-8 and vice versa, according to various embodiments.

At 902, the method 900 may include providing a die (e.g., die 102, 200, 500, 600, 700, or 800 of respective FIG. 1, 2, 3, 4, 5, 6, 7 or 8) having a bulk semiconductor material (e.g., bulk semiconductor material 102a of FIGS. 1-8) disposed between a first side (e.g., S1 of FIGS. 1-8) and a second side (e.g., S2 of FIGS. 1-8) of the die. In some embodiments, the die may be in wafer form to facilitate semiconductor processing.

At 904, the method 900 may include forming active circuitry on the first side of the die. For example, a device layer (e.g., device layer 102b of FIGS. 1-8) having active circuitry such as one or more transistors may be formed on the bulk semiconductor material. An interconnect layer (e.g., interconnect layer 102c of FIGS. 1-8) may be formed on the device layer to route electrical signals of the active circuitry.

At 906, the method 900 may include forming a device including one or more through-silicon via (TSV) based capacitors, resistors, or resonators in the bulk semiconductor material. The one or more TSV-based capacitors may be formed, for example, according to techniques described in connection with FIGS. 2-5 and 10. The one or more TSV-based resistors may be formed according to techniques described in connection with FIGS. 6-7 and 11. The one or more TSV-based resonators may be formed according to techniques described in connection with FIGS. 8 and 12.

According to various embodiments, forming the one or more TSV-based capacitors, resistors, or resonators comprises forming one or more TSV structures (e.g., TSV structures 224 of FIGS. 1-8) that extend through the bulk semiconductor material, providing an electrically insulative material (e.g., electrically insulative material 250 of FIGS. 2-7 or first dielectric liner 250a, second dielectric liner 250b or air gap 888 of FIG. 8) in the one or more TSV structures and providing an electrode material (e.g., electrode material of second electrode 240 of FIGS. 2-4 and 8) or resistor material (resistor material 642 of FIGS. 6-7) in direct contact with the electrically insulative material within the one or more TSV structures.

Figure 10:
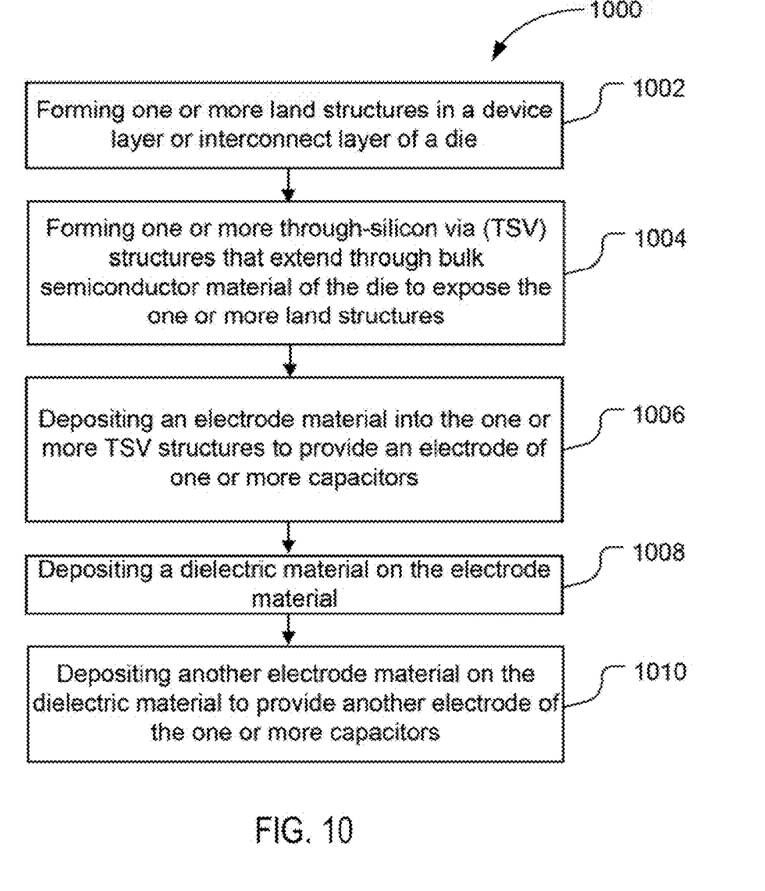
FIG. 10 schematically illustrates a flow diagram for a method of fabricating a die including a TSV-based capacitor, in accordance with some embodiments.

FIG. 10 schematically illustrates a flow diagram for a method 1000 of fabricating a die (e.g., die 200, 300, 400, or 500 of FIG. 2, 3, 4, or 5) including a TSV-based capacitor, in accordance with some embodiments. The method 1000 may comport with techniques described in connection with FIGS. 2-5 and vice versa, in some embodiments.

At 1002, the method 1000 may include forming one or more land structures (e.g., catch cups 234 of die 500a in FIG. 5) in a device layer or interconnect layer (e.g., device/interconnect layer 502d of the 500a in FIG. 5).

At 1004, the method 1000 may include forming one or more TSV structures (e.g., TSV structures 224 of die 500b in FIG. 5) through bulk semiconductor material (e.g., bulk semiconductor material 102a of die 500b in FIG. 5) to expose the one or more land structures. In embodiments, forming the one or more TSV structures may include removing portions of the bulk semiconductor material to form one or more corresponding openings (e.g., openings 225 of die 500b in FIG. 5).

At 1006, the method 1000 may include depositing an electrode material (e.g., electrode material 232 of die 500c in FIG. 5) into the one or more TSV structures to provide an electrode (e.g., second electrode 240 of FIGS. 2-4) of one or more capacitors.

At 1008, the method 1000 may include depositing a dielectric material (e.g., electrically insulative material 250 of die 500d in FIG. 5) on the electrode material.

At 1010, the method 1000 may include depositing another electrode material (e.g., electrode material of first electrode 230 of die 500e in FIG. 5) on the dielectric material to provide another electrode (e.g., first electrode 230 of FIGS. 2-4) of the one or more capacitors.

Figure 11:
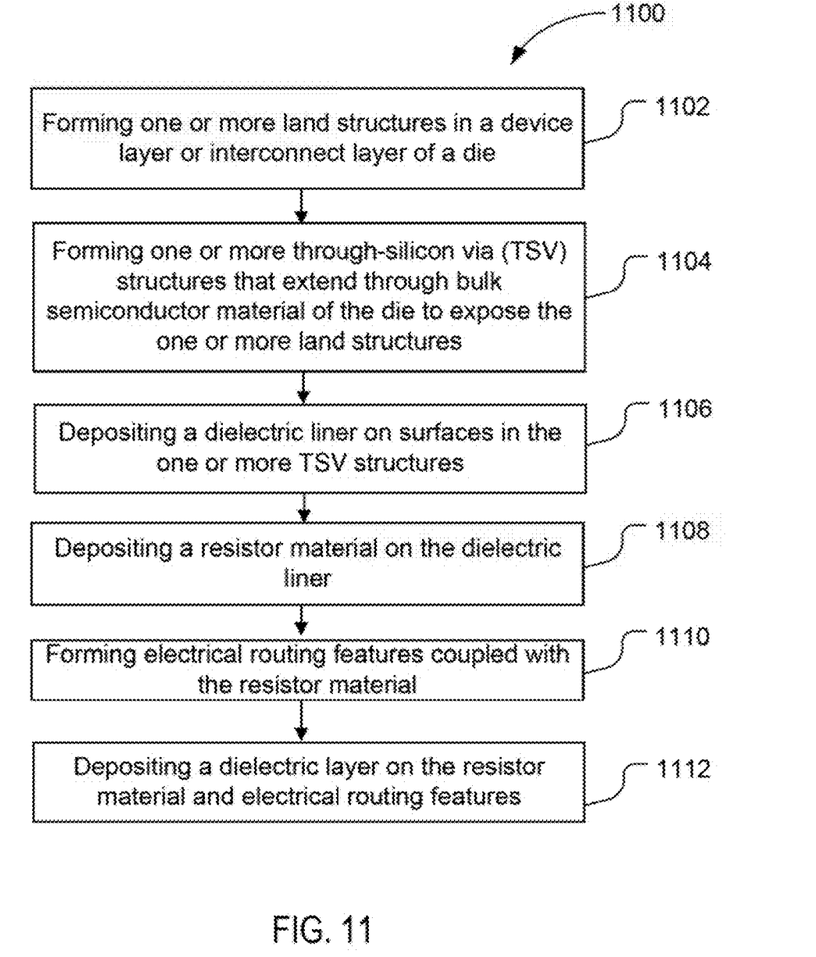
FIG. 11 schematically illustrates a flow diagram for a method of fabricating a die including a TSV-based resistor, in accordance with some embodiments.

FIG. 11 schematically illustrates a flow diagram for a method 1100 of fabricating a die (e.g., die 600 or 700 of FIG. 6 or 7) including a TSV-based resistor, in accordance with some embodiments. The method 1100 may comport with techniques described in connection with FIGS. 6-7 and vice versa, in some embodiments.

At 1102, the method 1100 may include forming one or more land structures in a device layer or interconnect layer of a die. For example, the one or more land structures may include catch cups 234 similar to those described in connection with die 500a in FIG. 5. In some embodiments, forming the one or more land structures comprises depositing a metal or resistor material.

At 1104, the method 1100 may include forming one or more TSV structures that extend through bulk semiconductor material of the die to expose the one or more land structures. For example, forming the one or more TSV structures may comport with embodiments described in connection with forming TSV structures 224 of die 500b in FIG. 5. In embodiments, forming the one or more TSV structures may include removing portions of the bulk semiconductor material to form one or more corresponding openings such as, for example, openings 225 of die 500b in FIG. 5.

At 1106, the method 1100 may include depositing a dielectric liner (e.g., electrically insulative material 250 of FIGS. 6-7) on surfaces in the one or more TSV structures (e.g., one or more TSV structures 224 of FIGS. 6-7). For example, the dielectric liner may include electrically insulative material deposited to form a liner on sidewall surfaces of the one or more TSV structures that are exposed by removing portions of the bulk semiconductor material.

At 1108, the method 1100 may include depositing a resistor material (e.g., resistor material 642 of FIGS. 6-7) on the dielectric liner. In one embodiment, the resistor material may be deposited on the dielectric liner in the TSV structures without filling the TSV structures. In another embodiment, the resistor material may be deposited to substantially fill the TSV structures.

At 1110, the method 1100 may include forming electrical routing features coupled with the resistor material. For example, the electrical routing features may include RDL traces (e.g., traces 644 of FIGS. 6-7) and/or TSVs (e.g., TSVs 244 of FIGS. 6-7) to couple the TSV-based resistor to active circuitry.

At 1112, the method 1100 may include depositing a dielectric layer (e.g., electrically insulative material 250 of FIGS. 6-7) on the resistor material and electrical routing features.

Figure 12:
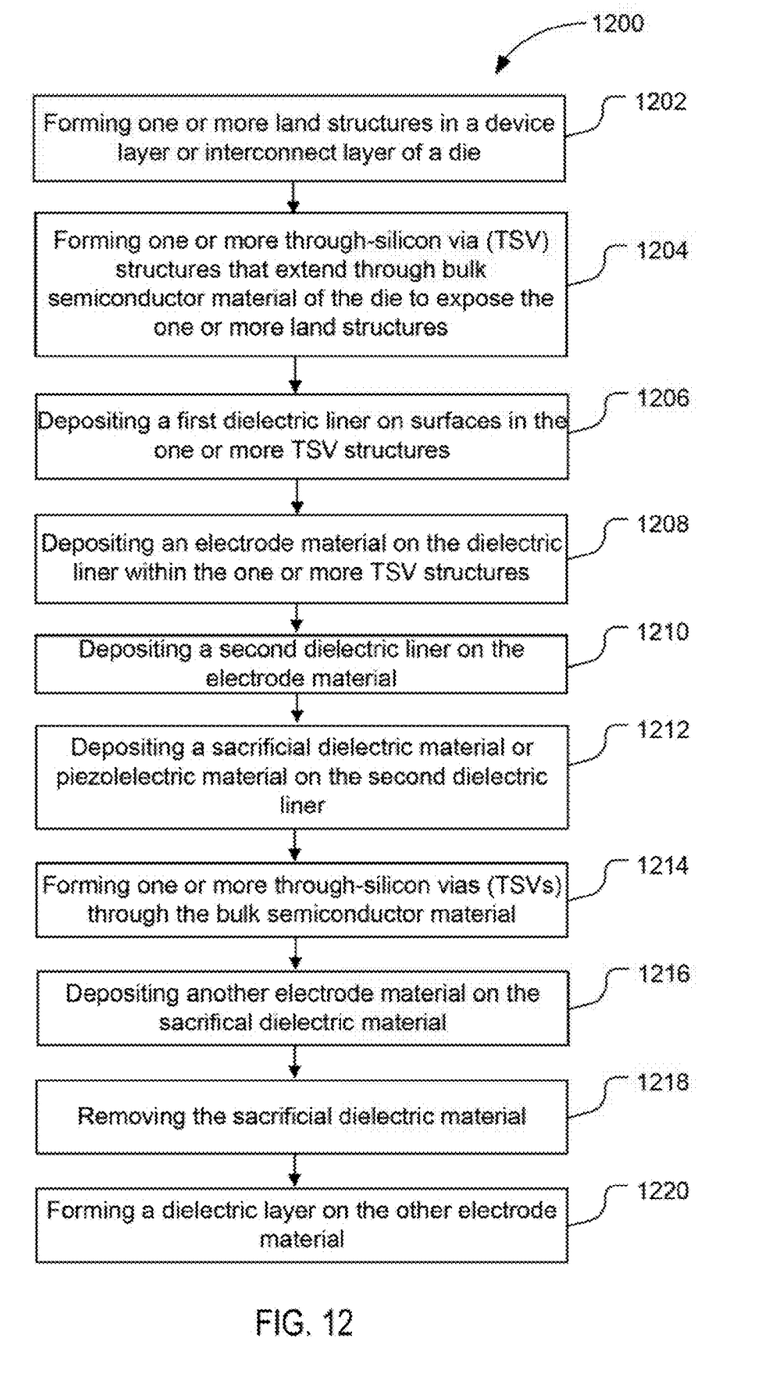
FIG. 12 schematically illustrates a flow diagram for a method of fabricating a die including a TSV-based resonator, in accordance with some embodiments.

FIG. 12 schematically illustrates a flow diagram for a method 1200 of fabricating a die (e.g., die 800 of FIG. 8) including a TSV-based resonator, in accordance with some embodiments. The method 1200 may comport with techniques described in connection with FIG. 8 and vice versa, in some embodiments.

At 1202, the method 1200 may include forming one or more land structures in a device layer or interconnect layer of a die. For example, the one or more land structures may include catch cups 234 similar to those described in connection with die 500a in FIG. 5. In some embodiments, forming the one or more land structures comprises depositing a metal.

At 1204, the method 1200 may include forming one or more TSV structures that extend through bulk semiconductor material of the die to expose the one or more land structures. For example, forming the one or more TSV structures may comport with embodiments described in connection with forming TSV structures 224 of die 500b in FIG. 5. In embodiments, forming the one or more TSV structures may include removing portions of the bulk semiconductor material to form one or more corresponding openings such as, for example, openings 225 of die 500b in FIG. 5.

At 1206, the method 1200 may include depositing a first dielectric liner (e.g., first dielectric liner 250a of FIG. 8) on surfaces in the one or more TSV structures (e.g., one or more TSV structures 224 of FIG. 8). For example, the dielectric liner may include electrically insulative material deposited to form a liner on sidewall surfaces of the one or more TSV structures that are exposed by removing portions of the bulk semiconductor material.

At 1208, the method 1200 may include depositing an electrode material (e.g., electrode material 234 of second electrode 240 of FIG. 8) on the dielectric liner within the one or more TSV structures.

At 1210, the method 1200 may include depositing a second dielectric liner (e.g., second dielectric liner 250b of FIG. 8) on the electrode material.

At 1212, the method 1200 may include depositing a sacrificial dielectric material or piezoelectric material on the second dielectric liner. The sacrificial dielectric material may include at least some portions that are configured for removal to provide an air gap (e.g., air gap 888 of FIG. 8) in some embodiments. The piezoelectric material may be part of a final product including the TSV-based resonator.

At 1214, the method 1200 may include forming one or more TSVs (e.g., TSVs 244 of FIG. 8) through the bulk semiconductor material. The TSVs may be configured to electrically couple a top electrode (e.g., first electrode 230 of FIG. 8) of the resonator with active circuitry in the device layer or interconnect layer (e.g., device layer 102b or interconnect layer 102c of FIG. 8). In some embodiments, the TSVs are configured to couple the top electrode with an inductor (e.g., inductor 843 of FIG. 8) in the interconnect layer.

At 1216, the method 1200 may include depositing another electrode material (e.g., electrode material of the first electrode 230 of FIG. 8) on the sacrificial dielectric material. For example, in some embodiments, the electrode material deposited at 1216 may include a network of RDL traces formed in a meshed structure with openings to facilitate removal of the sacrificial dielectric material to form an air gap. The electrode material deposited at 1208 and the other electrode material deposited at 1216 may be capacitively coupled.

At 1218, the method 1200 may include removing the sacrificial dielectric material. In an embodiment where sacrificial dielectric material is deposited at 1212, the sacrificial dielectric material is removed to provide an air gap (e.g., air gap 888 of FIG. 8). Some portions (e.g., third dielectric 250c of FIG. 8) of the sacrificial dielectric material may remain in the die subsequent to formation of the air gap.

At 1220, the method 1200 may include forming a dielectric layer (e.g., fourth dielectric 250d of FIG. 8) on the other electrode material (e.g., deposited at 1216).

Various operations are described as multiple discrete operations in turn, in a manner that is most helpful in understanding the claimed subject matter. However, the order of description should not be construed as to imply that these operations are necessarily order dependent. For example, actions of the method 1200 may be performed in another suitable order than depicted.

Figure 13:
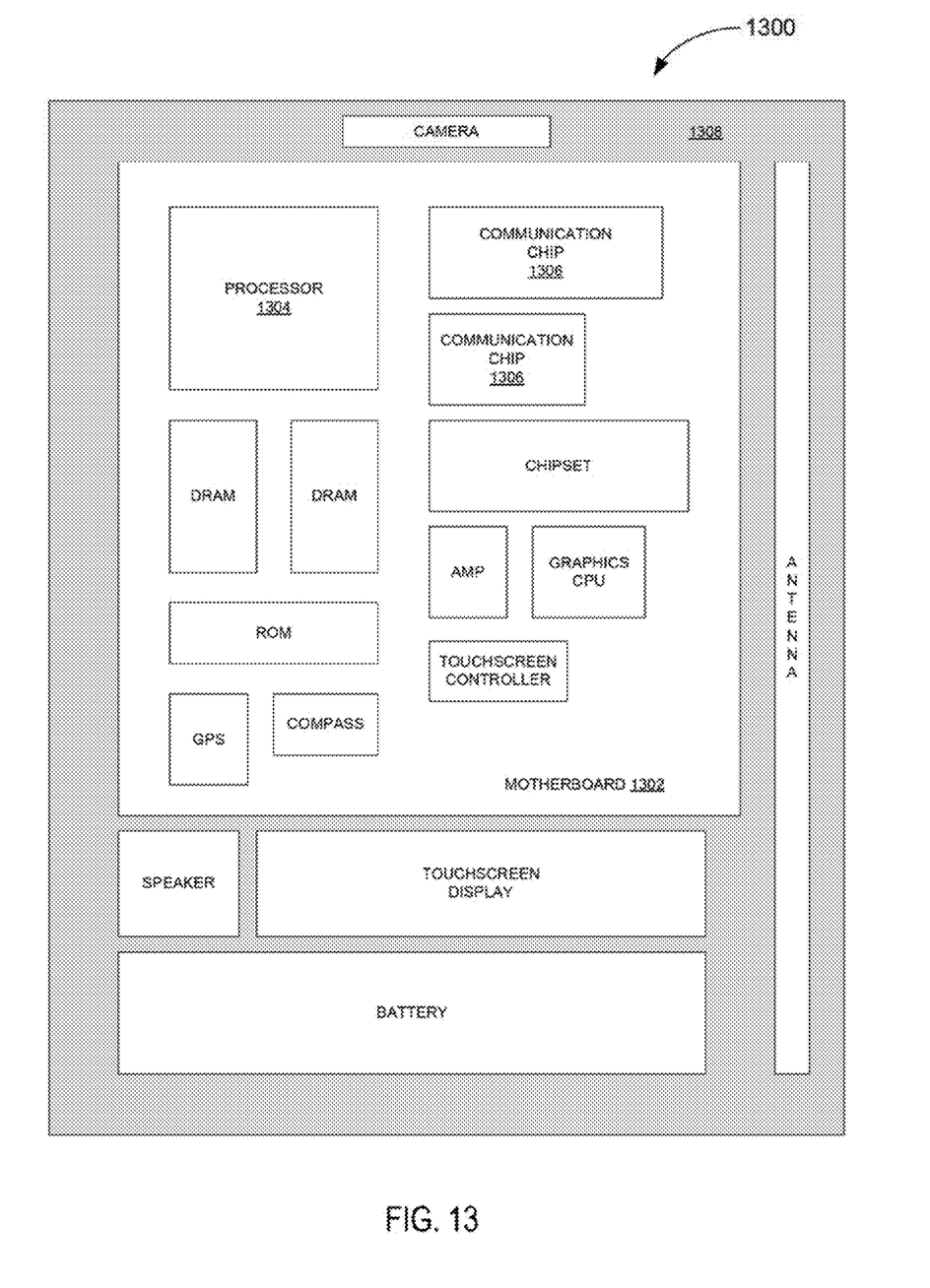
FIG. 13 schematically illustrates a computing device that includes an IC package assembly including a TSV-based device as described herein, in accordance with some embodiments.

Embodiments of the present disclosure may be implemented into a system using any suitable hardware and/or software to configure as desired. FIG. 13 schematically illustrates a computing device that includes an IC package assembly (e.g., package assembly 100 of FIG. 1) including a TSV-based device (e.g., TSV-based capacitor, TSV-based resistor, or TSV-based resonator) as described herein, in accordance with some embodiments. The computing device 1300 may house a board such as motherboard 1302 (e.g., in housing enclosure 1308). The motherboard 1302 may include a number of components, including but not limited to a processor 1304 and at least one communication chip 1306. The processor 1304 may be physically and electrically coupled to the motherboard 1302. In some implementations, the at least one communication chip 1306 may also be physically and electrically coupled to the motherboard 1302. In further implementations, the communication chip 1306 may be part of the processor 1304.

Depending on its applications, computing device 1300 may include other components that may or may not be physically and electrically coupled to the motherboard 1302. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, a solar panel, a flexible display, and a mass storage device (such as hard disk drive, compact disk (CD), digital versatile disk (DVD), and so forth).

The communication chip 1306 may enable wireless communications for the transfer of data to and from the computing device 1300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1306 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1306 may operate in accordance with a Global System for Mobile Communication (GSM), General Packet Radio Service (GPRS). Universal Mobile Telecommunications System (UMTS), High Speed Packet Access (HSPA), Evolved HSPA (E-HSPA), or LTE network. The communication chip 1306 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1306 may operate in accordance with Code Division Multiple Access (COMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 1306 may operate in accordance with other wireless protocols in other embodiments.

The computing device 1300 may include a plurality of communication chips 1306. For instance, a first communication chip 1306 may be dedicated to shorter range wireless communications such as Wi-Fi and Bluetooth, and a second communication chip 1306 may be dedicated to longer range wireless communications such as GPS, EDGE, GPRS, CDMA, WiMAX, LTE, Ev-DO, and others.

The processor 1304 of the computing device 1300 may be packaged in an IC package assembly (e.g., package assembly 100 of FIG. 1) including a TSV-based device (e.g., TSV-based capacitor, TSV-based resistor, or TSV-based resonator) as described herein. For example, the circuit board 122 of FIG. 1 may be a motherboard 1302, and the processor 1304 may be a die 102 mounted on a package substrate 121 of FIG. 1. The package substrate 121 and the motherboard 1302 may be coupled together using package-level interconnect structures (e.g., solder balls 112 of FIG. 1). The term "processor" may refer to any device or portion of a device that processes electronic data from registers and/or memory to transform that electronic data into other electronic data that may be stored in registers and/or memory.

The communication chip 1306 may also include a die that may be packaged in an IC package assembly (e.g., package assembly 100 of FIG. 1) including a TSV-based device (e.g., TSV-based capacitor, TSV-based resistor, or TSV-based resonator) as described herein. In further implementations, another component (e.g., memory device or other integrated circuit device) housed within the computing device 1300 may include a die that may be packaged in an IC package assembly including a TSV-based device (e.g., TSV-based capacitor, TSV-based resistor, or TSV-based resonator) as described herein.

In various implementations, the computing device 1300 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. The computing device 1300 may be a mobile computing device in some embodiments. In further implementations, the computing device 1300 may be any other electronic device that processes data.

EXAMPLES

According to various embodiments, the present disclosure describes an apparatus, Example 1 of the apparatus may include a die having active circuitry disposed on a first side of the die and a second side disposed opposite to the first side, a bulk semiconductor material disposed between the first side and the second side of the die and a device including one or more of a capacitor, resistor, or resonator disposed in the bulk semiconductor material, the capacitor, resistor, or resonator including one or more through-silicon via (TSV) structures that extend through the bulk semiconductor material, an electrically insulative material disposed in the one or more TSV structures and an electrode material resistor material in contact with the electrically insulative material within the one or more TSV structures, Example 2 may include the apparatus of Example 1, wherein the device is a capacitor and the electrode material is configured to provide an electrode for the capacitor. Example 3 may include the apparatus of Example 2, wherein the electrode material comprises a first electrode, the apparatus further comprising a second electrode disposed on surfaces of the one or more TSV structures, wherein the first electrode and the second electrode are capacitively coupled through the electrically insulative material. Example 4 may include the apparatus of Example 3, wherein the second electrode includes portions disposed on sidewalls of the one or more TSV structures and portions that are disposed in a device layer or interconnect layer of the die, Example 5 may include the apparatus of Example 3, further comprising a passivation layer disposed on the first electrode, wherein the first electrode includes one or more portions that extend a distance into the one or more TSV structures that is greater than half of a thickness of the bulk semiconductor material. Example 6 may include the apparatus of Example 3, wherein the first electrode comprises metal and the second electrode comprises silicon or metal. Example 7 may include the apparatus of Example 2, wherein the electrode material includes portions that extend from the second side of the die through the bulk semiconductor material and into a device layer or interconnect layer of the die. Example 8 may include the apparatus of any of Examples 2-7, wherein the one or more capacitors are configured to provide power to the active circuitry disposed on the first side of the die. Example 9 may include the apparatus of any of Examples 2-7, wherein the die is a first die, the apparatus further comprising one or more interconnects coupled with the electrode material, wherein the one or more capacitors are configured to provide power to active circuitry of a second die through the one or more interconnects. Example 10 may include the apparatus of Example 1, wherein the device is a resistor. Example 11 may include the apparatus of Example 10, wherein the resistor material comprises a carbon-based material or ceramic-based material. Example 12 may include the apparatus of Example 11, wherein the resistor material comprises tantalum nitride, lead oxide, ruthenium oxide, nickel chromium or bismuth iridate. Example 13 may include the apparatus of any of Examples 10-12, wherein portions of the resistor material are disposed in a device layer or interconnect layer of the die, Example 14 may include the apparatus of any of Examples 10-12, further comprising one or more electrical routing features disposed on the second side of the die and electrically coupled with the resistor material, one or more through-silicon vias (TSVs) that extend through the bulk semiconductor material and are configured to route electrical signals between the first side of the die and the one or more electrical routing features and an electrically insulative layer disposed on the one or more electrical routing features and the resistor material. Example 15 may include the apparatus of Example 1, wherein the device is a microelectromechanical (MEM) resonator. Example 16 may include the apparatus of Example 15, wherein the MEM resonator is an acceleration sensor. Example 17 may include the apparatus of Example 15, wherein the electrode material comprises a first electrode, the apparatus further comprising a second electrode disposed on surfaces of the one or more TSV structures, wherein the first electrode and the second electrode are capacitively coupled through the electrically insulative material. Example 18 may include the apparatus of Example 17, wherein the second electrode includes first portions that are disposed on a dielectric liner that is disposed on sidewalls of the one or more TSV structures and second portions that are disposed in a device layer or interconnect layer of the die. Example 19 may include the apparatus of Example 18, wherein the electrically insulative material comprises air or a piezoelectric material, the apparatus further comprising a first dielectric liner disposed between the second electrode and the bulk semiconductor material and a second dielectric liner disposed between the second electrode and the electrically insulative material Example 20 may include the apparatus of any of Examples 18-19, further comprising an inductor disposed in an interconnect layer of the die and electrically coupled with the second portions of the second electrode.

According to various embodiments, the present disclosure describes a method. Example 21 of a method may include providing a die having a first side and a second side disposed opposite to the first side, and a bulk semiconductor material disposed between the first side and the second side forming active circuitry on the first side of the die and forming a device including one or more of a capacitor, resistor or resonator by forming one or more through-silicon via (TSV) structures that extend through the bulk semiconductor material, providing an electrically insulative material in the one or more TSV structures and providing an electrode material or resistor material in direct contact with the electrically insulative material within the one or more TSV structures. Example 22 may include the method of Example 21, wherein forming the device comprises forming a capacitor, providing the electrode material comprises depositing the electrode material to form a first electrode, forming the one or more TSV structures comprises removing portions of the bulk semiconductor material to form one or more corresponding openings through the bulk semiconductor material and forming the capacitor further comprises forming a second electrode on sidewall surfaces of the one or more TSV structures that are exposed by removing portions of the bulk semiconductor material, wherein the first electrode and the second electrode are capacitively coupled through the electrically insulative material. Example 23 may include the method of Example 22, wherein forming the second electrode further comprises forming one or more and structures in a device layer or interconnect layer of the die, wherein removing the portions of the bulk semiconductor material to form the one or more corresponding openings through the bulk semiconductor material exposes the one or more land structures. Example 24 may include the method of Example 21, wherein forming the device comprises forming a resistor, providing the resistor material comprises depositing the resistor material on the electrically insulative material, forming the one or more TSV structures comprises removing portions of the bulk semiconductor material to form one or more corresponding openings through the bulk semiconductor material, providing the electrically insulative material comprises depositing the electrically insulative material to form a liner on sidewall surfaces of the one or more TSV structures that are exposed by removing portions of the bulk semiconductor material. Example 25 may include the method of Example 21, wherein forming the device comprises forming a resonator, providing the electrically insulative material comprises forming an air gap or depositing a piezoelectric material, providing the electrode material comprises depositing the electrode material to form a first electrode, forming the one or more TSV structures comprises removing portions of the bulk semiconductor material to form one or more corresponding openings through the bulk semiconductor material, forming the resonator further comprises forming a dielectric liner on sidewall surfaces of the one or more TSV structures that are exposed by removing portions of the bulk semiconductor material and forming the resonator further comprises forming a second electrode on the dielectric liner, wherein the first electrode and the second electrode are capacitively coupled through the electrically insulative material.

Various embodiments may include any suitable combination of the above-described embodiments including alternative (or) embodiments of embodiments that are described in conjunctive form (and) above (e.g., the "and" may be "and/or") Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An apparatus comprising:
a die having active circuitry disposed on a first side of the die and a second side disposed opposite to the first side;
a bulk semiconductor material disposed between the first side and the second side of the die; and
a device including a resonator disposed in the bulk semiconductor material, the resonator including:
one or more through-silicon via (TSV) structures that extend through the bulk semiconductor material;
an electrically insulative material disposed in the one or more TSV structures;

an electrode material in contact with the electrically insulative material within the one or more TSV structures, wherein the electrode material is a first electrode; and a second electrode coupled to an interconnect layer on the bulk semiconductor material.

2. The apparatus of claim 1, wherein the electrode material is to provide an electrode for the resonator.

3. The apparatus of claim 2, wherein:
the second electrode is disposed on surfaces of the one or more TSV structures, wherein the first electrode and the second electrode are coupled through the electrically insulative material.

4. The apparatus of claim 3, wherein:
the second electrode includes portions disposed on sidewalls of the one or more TSV structures and portions that are disposed in a device layer or interconnect layer of the die.

5. The apparatus of claim 3, further comprising:
a passivation layer disposed on the first electrode, wherein the first electrode includes one or more portions that extend a distance into the one or more TSV structures that is greater than half of a thickness of the bulk semiconductor material.

6. The apparatus of claim 3, wherein the first electrode comprises metal and the second electrode comprises silicon or metal.

7. The apparatus of claim 2, wherein the electrode material includes portions that extend from the second side of the die through the bulk semiconductor material and into a device layer or interconnect layer of the die.

8. The apparatus of claim 1, wherein the device is a microelectromechanical (MEM) resonator.

9. The apparatus of claim 8, wherein the MEM resonator is an acceleration sensor.

10. The apparatus of claim 8, wherein the first electrode and the second electrode are capacitively coupled through the electrically insulative material.

11. The apparatus of claim 10, wherein the second electrode includes first portions that are disposed on a dielectric liner that is disposed on sidewalls of the one or more TSV structures and second portions that are disposed in a device layer or interconnect layer of the die.

12. The apparatus of claim 11, wherein the electrically insulative material comprises air or a piezoelectric material, the apparatus further comprising:
a first dielectric liner disposed between the second electrode and the bulk semiconductor material; and
a second dielectric liner disposed between the second electrode and the electrically insulative material.

13. The apparatus of claim 11, further comprising:
an inductor disposed in an interconnect layer of the die and electrically coupled with the second portions of the second electrode.

14. An apparatus comprising:
a die having active circuitry disposed on a first side of the die and a second side disposed opposite to the first side;
a bulk semiconductor material disposed between the first side and the second side of the die; and
a device including a resistor disposed in the bulk semiconductor material, the resistor including:
one or more through-silicon via (TSV) structures that extend through the bulk semiconductor material;
an electrically insulative material disposed in the one or more TSV structures;
a resistor material in contact with the electrically insulative material within the one or more TSV structures;
one or more interconnect layers disposed on the second side of the die and electrically coupled with the resistor material;
one or more through-silicon vias (TSVs) that extend through the bulk semiconductor material and are to route electrical signals between the first side of the die and the one or more interconnect layers; and
an electrically insulative layer disposed on the one or more interconnect layers and the resistor material.

15. The apparatus of claim 14, wherein portions of the resistor material are disposed in a device layer or interconnect layer of the die.

16. The apparatus of claim 14, wherein the resistor material comprises a carbon-based material or ceramic-based material.

17. The apparatus of claim 16, wherein the resistor material comprises tantalum nitride, lead oxide, ruthenium oxide, nickel chromium or bismuth iridate.

18. A method comprising:
providing a die having
a first side and a second side disposed opposite to the first side, and
a bulk semiconductor material disposed between the first side and the second side;
forming active circuitry on the first side of the die; and
forming a device including a resonator by:
forming one or more through-silicon via (TSV) structures that extend through the bulk semiconductor material;
providing an electrically insulative material in the one or more TSV structures;
providing first electrode material in direct contact with the electrically insulative material within the one or more TSV structures; and
providing a second electrode coupled to an interconnect layer on the bulk semiconductor material.

19. The method of claim 18, wherein providing the second electrode further comprises:
forming one or more land structures in a device layer or interconnect layer of the die, wherein removing the portions of the bulk semiconductor material to form one or more corresponding openings through the bulk semiconductor material exposes the one or more land structures.

20. The method of claim 18, wherein:
forming the device comprises forming a resonator;
providing the electrically insulative material comprises forming an air gap or depositing a piezoelectric material;
providing the first electrode material comprises depositing the first electrode material to form a first electrode;
forming the one or more TSV structures comprises removing portions of the bulk semiconductor material to form one or more corresponding openings through the bulk semiconductor material;
forming the resonator further comprises forming a dielectric liner on sidewall surfaces of the one or more TSV structures that are exposed by removing portions of the bulk semiconductor material; and
forming the resonator further comprises forming the second electrode on the dielectric liner, wherein the first electrode and the second electrode are capacitively coupled through the electrically insulative material.

* * * * *